United States Patent
Leobandung

(10) Patent No.: US 9,318,392 B1
(45) Date of Patent: Apr. 19, 2016

(54) METHOD TO FORM SOI FINS ON A BULK SUBSTRATE WITH SUSPENDED ANCHORING

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/743,594

(22) Filed: Jun. 18, 2015

(51) Int. Cl.
  *H01L 27/12* (2006.01)
  *H01L 21/84* (2006.01)
  *H01L 21/762* (2006.01)

(52) U.S. Cl.
  CPC ........ *H01L 21/845* (2013.01); *H01L 21/76202* (2013.01); *H01L 27/1211* (2013.01)

(58) Field of Classification Search
  CPC ............ H01L 21/845; H01L 21/76202; H01L 27/1211
  See application file for complete search history.

(56) References Cited

U.S. PATENT DOCUMENTS

| | | | |
|---|---|---|---|
| 7,300,837 B2 | 11/2007 | Chen et al. | |
| 7,709,341 B2 * | 5/2010 | Fucsko | H01L 21/30608 257/E21.216 |
| 8,384,142 B2 | 2/2013 | Juengling | |
| 8,766,363 B2 | 7/2014 | Cheng et al. | |
| 8,889,564 B2 | 11/2014 | Cheng et al. | |
| 8,956,942 B2 | 2/2015 | Loubet et al. | |
| 8,969,155 B2 * | 3/2015 | Cheng | H01L 29/66795 257/347 |
| 2014/0001562 A1 | 1/2014 | Liaw | |
| 2014/0191321 A1* | 7/2014 | Cheng | H01L 21/76283 257/347 |
| 2014/0256110 A1 | 9/2014 | Lung et al. | |
| 2014/0353767 A1* | 12/2014 | Liu | H01L 21/845 257/401 |
| 2015/0021691 A1 | 1/2015 | Akarvardar et al. | |

\* cited by examiner

*Primary Examiner* — Shaun Campbell
(74) *Attorney, Agent, or Firm* — Scully, Scott, Murphy & Presser, P.C.; Louis J. Percello, Esq.

(57) ABSTRACT

A method of fabricating non-tilted, electrically isolated fins from a bulk substrate is provided. A plurality of semiconductor fins is formed extending upwards from a remaining portion of a bulk semiconductor substrate. Each semiconductor fin includes a hard mask cap. A sacrificial dielectric material portion is formed between each semiconductor fin, wherein each sacrificial dielectric material portion has a topmost surface that is vertically offset and located below a topmost surface of each hard mask cap. An anchoring structure having an opening is then formed atop each sacrificial dielectric material portion and each hard mask cap. Next, an entirety of each sacrificial dielectric material portion is removed by etching through the opening. An oxide layer is then formed within an upper portion of the remaining portion of the bulk semiconductor substrate, wherein a portion of the oxide layer extends beneath each semiconductor fin. Next, the anchoring structure is removed.

14 Claims, 6 Drawing Sheets

METHOD TO FORM SOI FINS ON A BULK SUBSTRATE WITH SUSPENDED ANCHORING

BACKGROUND

The present application relates to semiconductor technology and more particularly to a method of forming semiconductor fins on an oxide layer that is formed into a bulk semiconductor substrate. The present application also relates to a semiconductor structure that is formed by the method of the present application.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

In order to electrically isolate finFETs from the underlying substrate, finFETs may be fabricated from a semiconductor-on-insulator (SOI) substrate, where the semiconductor fin may be separated from a base substrate by a buried insulator layer. FinFETs may also be fabricated from bulk semiconductor substrates to reduce wafer cost and/or enable formation of certain devices in the bulk substrate. However, the fins of finFETs fabricated from bulk semiconductor substrates are typically not electrically isolated from the bulk semiconductor substrate, potentially resulting in reduced device performance.

One method of forming fins that are electrically isolated from the bulk semiconductor substrate includes a bottom oxidation process. In such a process, semiconductor fins are formed within an upper semiconductor material portion of a bulk semiconductor substrate and thereafter oxidation is performed to provide an oxide region beneath each of the semiconductor fins. The aforementioned prior art process suffers from random semiconductor fin tilting. That is, the prior art bottom oxidation process may cause some of the semiconductor fins to be less than perpendicularly aligned to a horizontal surface of the substrate. Such fin titling, even if only a couple of degrees, may be problematic for future technology nodes.

SUMMARY

In one aspect of the present application, a method of fabricating semiconductor fins that are electrically isolated from a bulk semiconductor substrate without fin tilting is provided. In one embodiment of the present application, the method includes forming a plurality of semiconductor fins extending upwards from a remaining portion of a bulk semiconductor substrate, wherein a hard mask cap is present on each semiconductor fin of the plurality of semiconductor fins. Next, a sacrificial dielectric material portion is formed between each semiconductor fin of the plurality of semiconductor fins, wherein each sacrificial dielectric material portion has a topmost surface that is vertically offset and located below a topmost surface of each hard mask cap. An anchoring structure having an opening is then formed atop each sacrificial dielectric material portion and each hard mask cap. The opening is located in an area between the semiconductor fins. Next, an entirety of each sacrificial dielectric material portion is removed by etching through the opening in the anchoring structure. An oxide layer is then formed within an upper portion of the remaining portion of the bulk semiconductor substrate, wherein a portion of the oxide layer extends beneath each semiconductor fin. Next, the anchoring structure is removed.

In another aspect of the present application, a semiconductor structure is provided. In one embodiment of the present application, the semiconductor structure includes a plurality of semiconductor fins extending upwards from an oxide layer that is present on an entirety of a bulk semiconductor material, the oxide layer having a first portion of a first thickness beneath each semiconductor fin, at least one second portion of a second thickness that is located adjacent at least one of the semiconductor fins and third portions of a third thickness that constitutes a remainder of the oxide layer, wherein the first thickness is greater than the second thickness, and the second thickness is greater than the third thickness.

DETAILED DESCRIPTION

Figure 1:
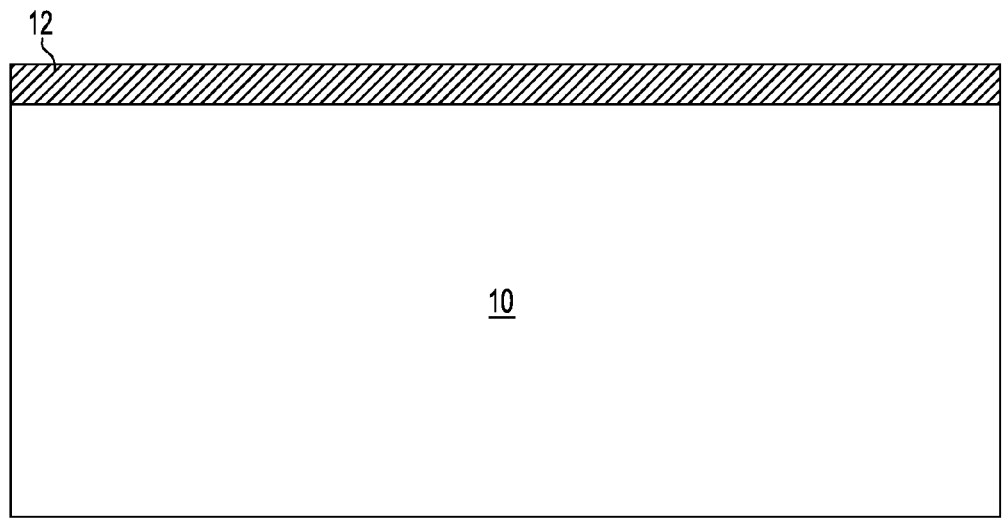
FIG. 1 is a cross sectional view of an exemplary semiconductor structure including a hard mask layer on a surface of a bulk semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a hard mask layer 12 on a surface of a bulk semiconductor substrate 10 that can be employed in accordance with an embodiment of the present application.

The term "bulk" used in conjunction with the phrase "bulk semiconductor substrate 10" denotes a substrate that is entirely composed of one or more semiconductor materials. The term "semiconductor" as used herein in connection with the term "bulk semiconductor substrate 10" denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the bulk semiconductor substrate 10 may be entirely composed of silicon. In another embodiment, at least an upper semiconductor material portion of the bulk semiconductor substrate 10 comprises silicon. The crystal orientation of the bulk semiconductor substrate 10 may be {100}, {110}, or {111}. Other crystallographic orientations besides those specifically mentioned can also be used in the present application. At least the upper semiconductor material portion of the bulk semiconductor substrate 10 is a crystalline semiconductor such as, for example, single crystalline silicon.

The hard mask layer 12 is a contiguous layer that covers an entirety of the topmost surface of the bulk semiconductor substrate 10. The hard mask layer 12 that can be employed in the present application may include a hard mask material such as, for example, a semiconductor oxide, a semiconductor nitride and/or a semiconductor oxynitride. In one embodiment, the hard mask material that can be used in providing the hard mask layer 12 can be comprised of silicon dioxide. In another embodiment, the hard mask material that can be used in providing the hard mask layer 12 can be comprised of silicon nitride. In yet another embodiment, the hard mask material that can be used in providing the hard mask layer 12 can be a stack comprised of, in any order, silicon dioxide and silicon nitride.

In some embodiments of the present application, the hard mask material that can be used in providing the hard mask layer 12 can be formed by a deposition process such as, for example, chemical vapor deposition (CVD) or plasma enhanced chemical vapor deposition (PECVD). In other embodiments, the hard mask material that can be used in providing the hard mask layer 12 can be formed by a thermal process such as, for example, thermal oxidation and/or thermal nitridation. In yet other embodiments, the hard mask material that can be used in providing the hard mask layer 12 can be formed by a combination of a deposition process and a thermal process. The thickness of the hard mask material that can be used in providing the hard mask layer 12 can range from 2 nm to 10 nm, although other thicknesses that are lesser than, or greater than, the aforementioned thickness range can be used for the hard mask layer 12.

Figure 2:
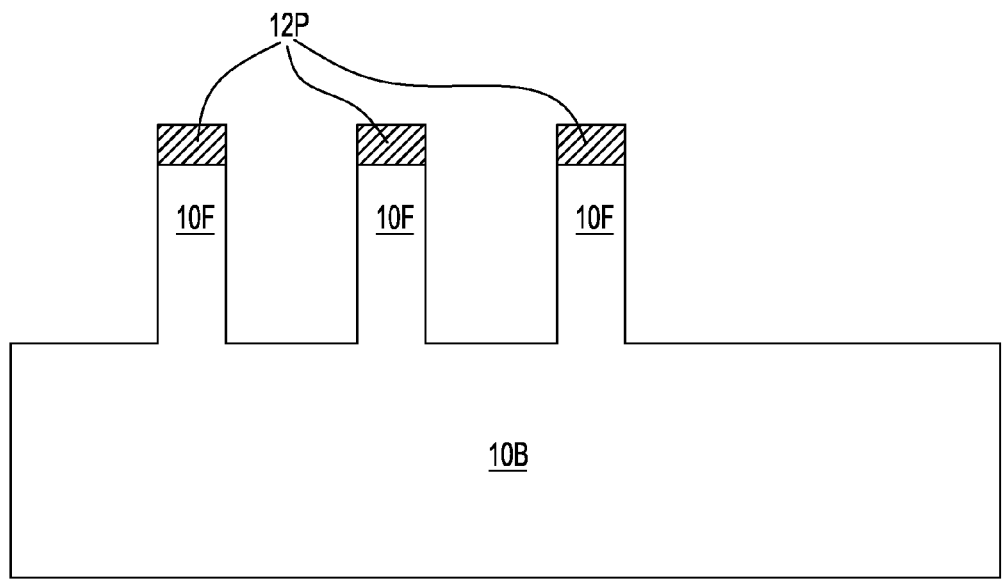
FIG. 2 is a cross sectional view of the exemplary semiconductor structure of FIG. 1 after patterning the hard mask layer and an upper semiconductor material portion of the bulk semiconductor substrate to provide a plurality of semiconductor fins extending upwards from a remaining portion of the bulk semiconductor substrate.

Referring now to FIG. 2, there is illustrated the exemplary semiconductor structure of FIG. 1 after patterning the hard mask layer 12 and an upper semiconductor material portion of the bulk semiconductor substrate 10 to provide a plurality of semiconductor fins 10F extending upwards from a remaining portion of the bulk semiconductor substrate 10. The remaining portion of the bulk semiconductor substrate 10 may be referred to herein as a base semiconductor material 10B. Each semiconductor fin 10F is capped with a remaining portion of the hard mask layer 12. Each remaining portion of the hard mask layer 12 may be referred to herein as a hard mask cap 12P.

In one embodiment of the present application, the patterning process comprises a sidewall image transfer (SIT) process. The SIT process includes forming a contiguous mandrel material layer (not shown) over the hard mask layer 12. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material layers, i.e., entirely through the hard mask layer 12 and partially through the bulk semiconductor substrate 10. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to provide the exemplary semiconductor structure shown in FIG. 2 may include lithography and etching. Lithography includes forming a photoresist material (not shown) on a topmost surface of the hard mask layer 12. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the hard mask layer 12. The pattern provided by the patterned photoresist material is thereafter transferred into the underlying hard mask layer 12 utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. The patterned resist material can be removed after transferring the pattern into the hard mask layer 12 utilizing any conventional resist stripping process such as, for example, ashing.

Each semiconductor fin 10F that is formed includes a pair of vertical sidewalls that are parallel to each other. As used herein, a surface is "vertical" if there exists a vertical plane from which the surface does not deviate by more than three times the root mean square roughness of the surface. Each semiconductor fin 10F comprises the same semiconductor material as the upper semiconductor material portion of the bulk semiconductor substrate 10. In one embodiment of the present application, each semiconductor fin 10F that is formed has a height from 10 nm to 100 nm, and a width from 5 nm to 30 nm. Other heights and widths that are lesser than, or greater than, the aforementioned ranges may also be used in the present application for each semiconductor fin 10F. Within a given device region, each semiconductor fin 10F is separated from its nearest neighboring semiconductor fin 12F by a pitch that is from 20 nm to 60 nm; the pitch can be measured from a central portion of one semiconductor fin 10F to a central portion of the nearest neighboring semiconductor fin 10F. Other pitches that are lesser than, or greater than the aforementioned pitch range may also be used in the present application.

Figure 3:
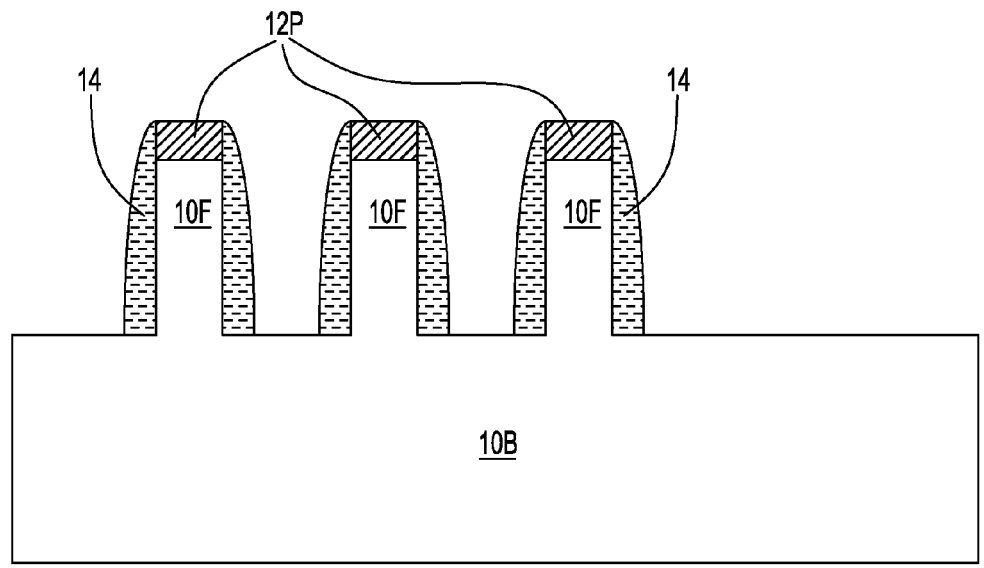
FIG. 3 is a cross sectional view of the exemplary semiconductor structure of FIG. 2 after forming a dielectric spacer on exposed sidewall surfaces of each semiconductor fin.

Referring now to FIG. 3, there is illustrated the exemplary semiconductor structure of FIG. 2 after forming a dielectric spacer 14 on exposed sidewall surfaces of each semiconductor fin 10F. As is shown, each dielectric spacer 14 has a base, i.e., bottommost surface, which is formed on a portion of the base semiconductor material 10B.

Each dielectric spacer 14 comprises a dielectric spacer material. The dielectric spacer material that provides each dielectric spacer 14 comprises a dielectric material such as, for example, an oxide, nitride, and/or oxynitride. In one example, each dielectric spacer 14 comprises silicon nitride. The dielectric spacer material can be formed by a deposition process including, for example, chemical vapor deposition, plasma enhanced chemical vapor deposition or physical vapor deposition. The dielectric spacer material is a conformal layer whose thickness can be from 5 nm to 30 nm. Other thicknesses are possible and are not excluded from being used in the present application. After forming the dielectric spacer material, a spacer etch, such as, for example, a reactive ion (RIE) etch, is employed in providing each dielectric spacer 14.

Figure 4:
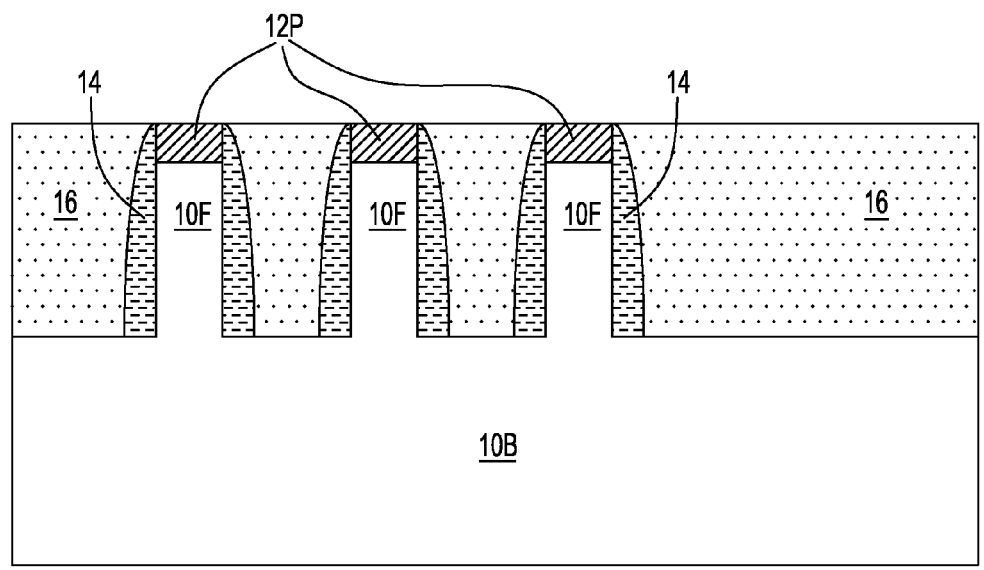
FIG. 4 is a cross sectional view of the exemplary semiconductor structure of FIG. 3 after forming a sacrificial dielectric material located between each semiconductor fin and having a topmost surface that is coplanar with a topmost surface of each hard mask cap that is present on each semiconductor fin.

Referring now to FIG. 4, there is illustrated the exemplary semiconductor structure of FIG. 3 after forming a sacrificial dielectric material 16 located between each semiconductor fin 10F and having a topmost surface that is coplanar with a topmost surface of each hard mask cap 12P that is present on each semiconductor fin 10F.

The sacrificial dielectric material 16 that is employed in the present application comprises any dielectric material that has a different etch rate than the hard mask cap 12P and the dielectric spacer 14. In some embodiments, the sacrificial dielectric material 16 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the sacrificial dielectric material 16. The use of a self-planarizing dielectric material as the sacrificial dielectric material 16 may avoid the need to perform a subsequent planarizing step.

In one embodiment, the sacrificial dielectric material 16 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the sacrificial dielectric material 16, a planarization process (such as, for example, chemical mechanical planarization or grinding) or an etch back process follows the deposition of the sacrificial dielectric material 16. The thickness of the sacrificial dielectric material 16 that can be employed in the present application may vary depending on the type of dielectric material employed as well as the method that was employed in forming the same. In one embodiment, the sacrificial dielectric material 16 has a thickness from 80 nm to 500 nm. Other thicknesses that are greater or lesser than the range provided above can also be used for the sacrificial dielectric material 16.

Figure 5:
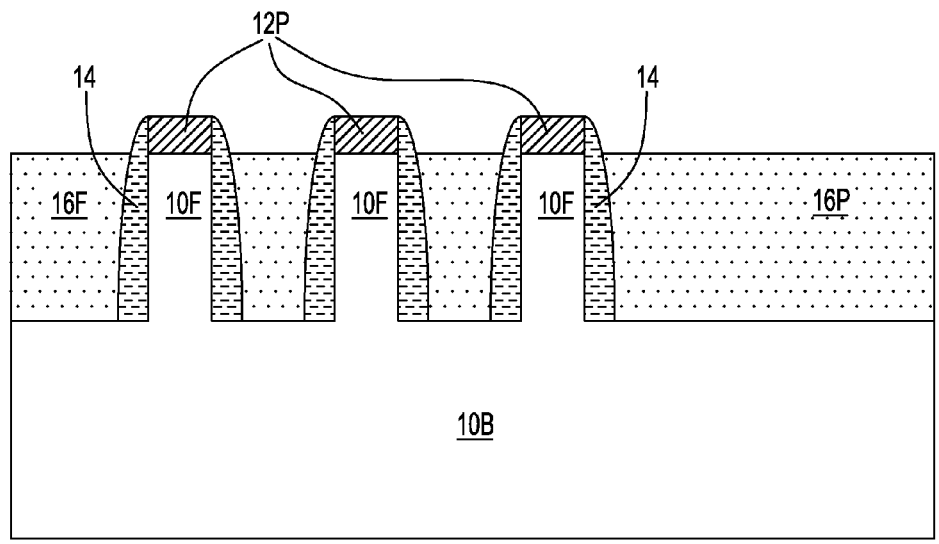
FIG. 5 is a cross sectional view of the exemplary semiconductor structure of FIG. 4 after removing an upper portion of the sacrificial dielectric material.

Referring now to FIG. 5, there is illustrated the exemplary semiconductor structure of FIG. 4 after removing an upper portion of the sacrificial dielectric material 16. The removal of the upper portion of the sacrificial dielectric material 16 may be performed utilizing a recess etching process that is selective in removing some of the dielectric material that provides the sacrificial dielectric material 16 relative to the dielectric material that provides each hard mask cap 12P and each dielectric spacer 14. In one embodiment, the recess etching process may include a chemical etchant such as, for example, hydrofluoric acid or a buffered oxide etch that includes a mixture of ammonia fluoride and hydrofluoric acid. In another embodiment, the recess etching process may include a dry etching process such as, for example, a timed reactive ion etch, in which a plasma of $CF_4$, $SF_6$ or $NF_3$ may be used.

The sacrificial dielectric material 16 that remains after the recess etch is referred to herein as a sacrificial dielectric material portion 16P. As is shown, a sacrificial dielectric material portion 16P is present between each semiconductor fin 10F. Each sacrificial dielectric material portion 16P that is formed has a topmost surface that is vertically offset and located below a topmost surface of each hard mask cap 12P. As is shown, an upper portion of each dielectric spacer 14 is exposed after performing the recess etching process mentioned above.

Figure 6:
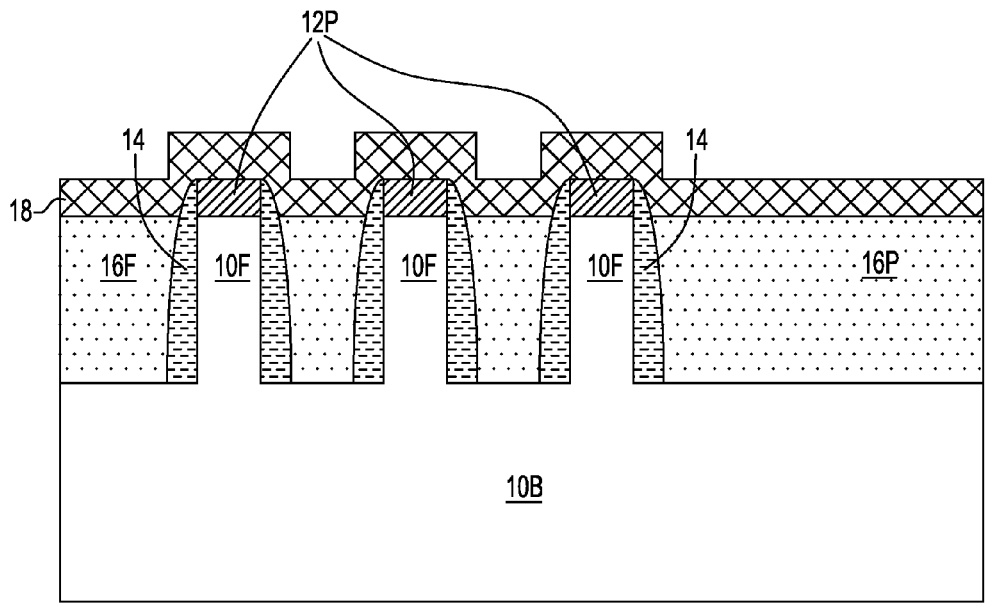
FIG. 6 is a cross sectional view of the exemplary semiconductor structure of FIG. 5 after forming an anchoring element.

Referring now to FIG. 6, there is illustrated the exemplary semiconductor structure of FIG. 5 after forming an anchoring element 18. As is shown, anchoring element 18 is formed on the exposed topmost surface of each sacrificial dielectric material portion 16P and on exposed surfaces of each dielectric spacer 14 and each hard mask cap 12P. Anchoring element 18 is a contiguous layer that covers the entirety of the exemplary semiconductor structure shown in FIG. 5.

Anchoring element 18 can include any material that has a different etch rate than the dielectric material that provides the sacrificial dielectric material 16. For example, anchoring element 18 may include an organic material, a dielectric material or a conductive material. In one embodiment, anchoring element 18 includes a dielectric material. In such an embodiment, the dielectric material that provides the anchoring element 18 may, or may not, be the same as the dielectric material that provides the hard mask layer 12. In one example, silicon nitride is used as the dielectric material for both the anchoring element 18 and the hard mask layer 12. In another example, silicon oxynitride is used as the dielectric material for providing the anchoring element 18, while silicon nitride is used as the dielectric material for providing the hard mask layer 12. The anchoring element 18 that is formed may have a thickness from 5 nm to 25 nm, although other thicknesses that are lesser than, or greater than, the aforementioned thickness range can be used for the anchoring element 18. The anchoring element 18 can be formed utilizing any known deposition process such as, for example, chemical vapor deposition or plasma enhanced chemical vapor deposition.

Figure 7A:
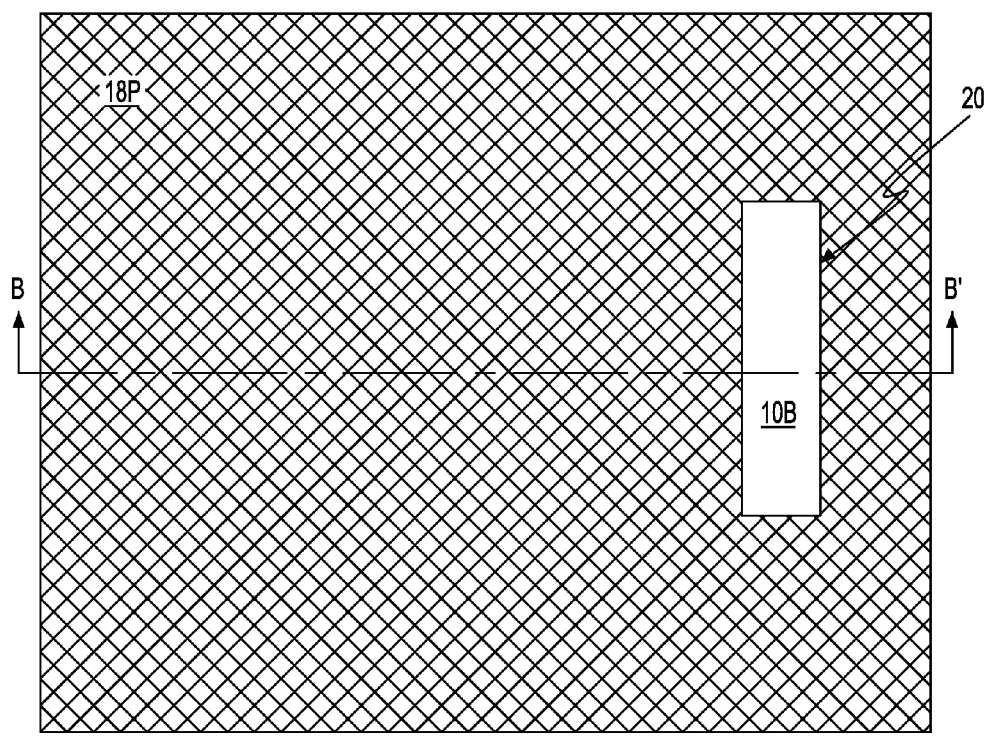
FIG. 7A is a top-down view of the exemplary semiconductor structure of FIG. 6 after forming an opening within the anchoring element and removing the remaining sacrificial dielectric material.
Figure 7B:
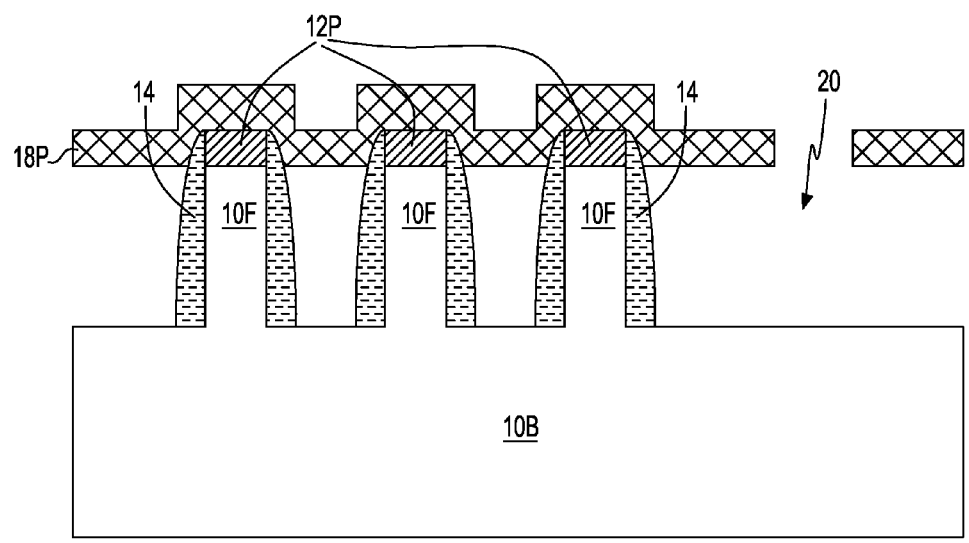
FIG. 7B is a cross sectional view of the exemplary semiconductor structure of FIG. 7A through vertical plane B-B'.

Referring now to FIGS. 7A-7B, there are illustrated various views of the exemplary semiconductor structure of FIG. 6 after forming an opening 20 within the anchoring element 18 and removing the remaining sacrificial dielectric material 16 (i.e., each sacrificial dielectric material portion 16P). As is shown in the top down view of FIG. 7A, the opening 20 is formed in an area of the exemplary semiconductor structure which is between the semiconductor fins 10F. Thus, the opening 20 is not located directly atop any semiconductor fin 10F or any hard mask cap 12P. In some embodiments of the present application, the opening 20 can be formed by patterning the anchoring element 18 by, for example, lithography and etching. In other embodiments, the opening 20 can be formed by physically or mechanically puncturing the anchoring element 18 with a pointed tip object. Although the present application describes and illustrates a single opening 20 within anchoring element 18, a plurality of such openings can be formed into the anchoring element 18.

After providing the opening 20, a portion of the anchoring element 18 remains. The remaining portion of the anchoring element 18 may be referred to herein as an anchoring structure 18P. Next, and with the anchoring structure 18P in place, an etch is performed through the opening 20 that is selective in removing the entirety of each sacrificial dielectric material portion 16P. The etch that is used to remove the entirety of each sacrificial dielectric material portion 16P from the exemplary semiconductor structure is a lateral etch that may include hydrofluoric acid or a buffered oxide etch as a chemical etchant.

Figure 8:
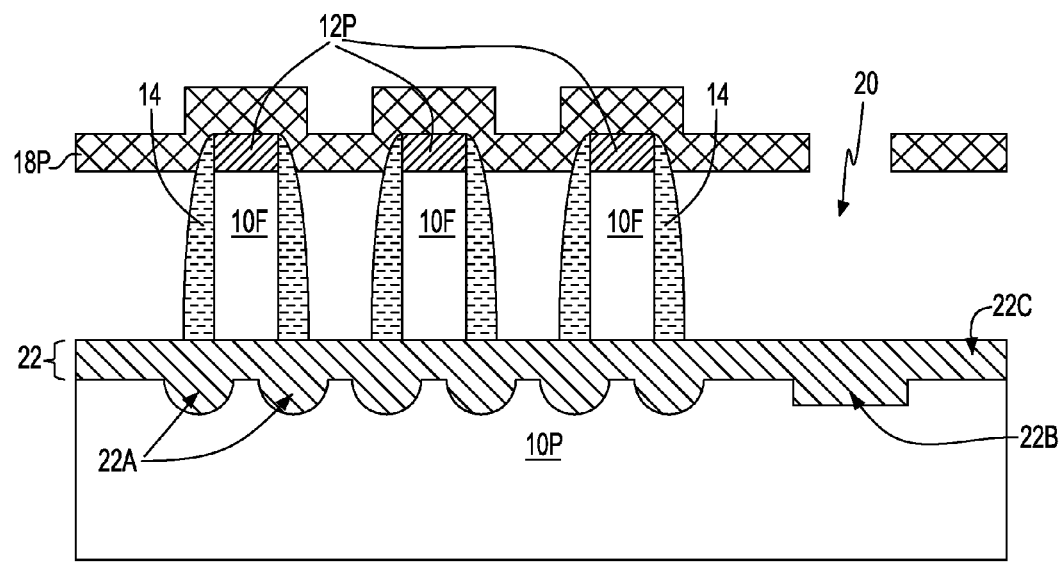
FIG. 8 is a cross sectional view of the exemplary semiconductor structure of FIGS. 7A-7B after performing a bottom oxidation process.

Referring now to FIG. 8, there is illustrated the exemplary semiconductor structure of FIGS. 7A-7B after performing a bottom oxidation process. The bottom oxidation process converts an upper portion of the base semiconductor material 10B into an oxide layer 22 that includes a semiconductor oxide, such as, for example, silicon dioxide. The semiconductor oxide is a thermal oxide, not a deposited oxide.

The oxide layer 22 includes a first portion 22A that extends beneath each semiconductor fin 10F which isolates the semiconductor fins 10F from a remaining portion of the base semiconductor material 10B. The remaining portion of the base semiconductor material 10B can be referred to herein a bulk semiconductor material 10P. The oxide layer 22 also includes other portions that extend across the entirety of the bulk semiconductor material 10P. The portion of the oxide layer 22 that is located directly beneath the opening 20 represents a second portion 22B of the oxide layer 22, while other portions of oxide layer 22 that are not directly under the semiconductor fins 10F or under the opening 20 represent third portions 22C of the oxide layer 22. In accordance with the present application, the second portion 22B of the oxide layer 22 has a thickness that is greater than a thickness of each third portion 22C of the oxide layer 22. Also, and in accordance with the present application, the first portion 22A of the oxide layer 22 has a thickness that is greater than a thickness of the second portion 22C of the oxide layer 22. Thus, and in the present application, the thickness of the first portion 22A of the oxide layer 22 is greater than the thickness of the second portion 22B of the oxide layer 22 which thickness of the second portion 22B of the oxide layer 22 is greater than the thickness of the third portion 22C of the oxide layer 22.

FIG. 8 thus illustrates a semiconductor structure that includes a plurality of semiconductor fins 10F extending upwards from an oxide layer 22 that is present on an entirety of a bulk semiconductor material 10P, the oxide layer 22 has a first portion 22A of a first thickness beneath each semiconductor fin 10F, at least one second portion 22B of a second thickness that is located adjacent at least one of the semiconductor fins 10F and third portions 22C of a third thickness that constitute a remainder of the oxide layer, wherein the first thickness is greater than the second thickness, and the second thickness is greater than the third thickness.

The bottom oxidation process is a thermal oxidation process that can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The bottom oxidation process can be performed at a temperature from 400° C. to 1300° C. The bottom oxidation process may include a furnace anneal, a rapid thermal anneal or any other anneal that can convert an upper semiconductor portion of the remaining portion of the bulk semiconductor substrate into a continuous oxide layer 22.

Unlike prior art bottom oxidation processes, the presence of the anchoring structure 18P during the thermal oxidation process prevents tilting of any of the semiconductor fin 10F since the semiconductor fins 10F are held in place by the anchoring structure 18P of the present application. Thus, each semiconductor fin 10F is non-titled meaning a vertical plane running through each semiconductor fin 10F is perpendicular to the topmost surface of the oxide layer 22.

Figure 9:
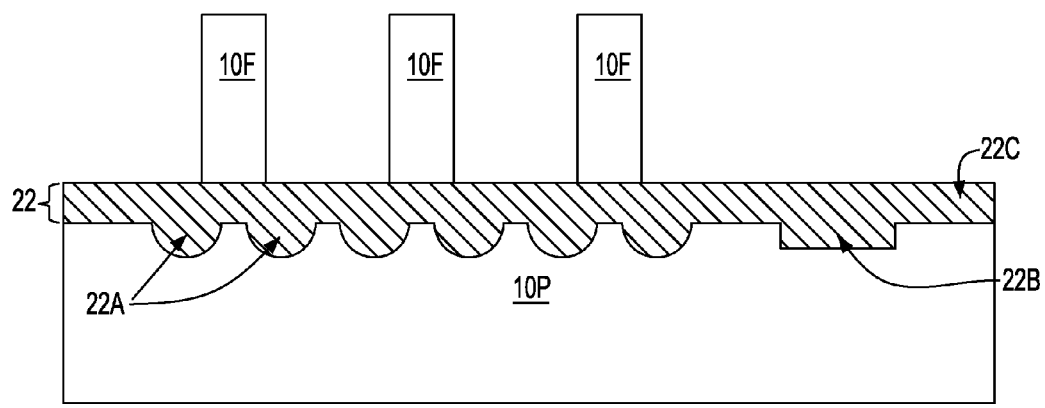
FIG. 9 is a cross sectional view of the exemplary semiconductor structure of FIG. 8 after removing the remaining portion of the anchoring element, each dielectric spacer and, optionally, each hard mask cap from atop each semiconductor fin.

Referring now to FIG. 9, there is illustrated the exemplary semiconductor structure of FIG. 8 after removing the remaining portion of the anchoring element 18 (i.e., anchoring structure 18P), each dielectric spacer 14 and optionally, each hard mask cap 12P from atop each semiconductor fin 10F. In some embodiments, the hard mask caps 12P remain atop each semiconductor fin 10F during further processing of the present application.

The anchoring structure 18P can be removed utilizing any material removal process that is selective in removing the material that provides the anchoring element 18. In one example, and when the anchoring element 18 comprises silicon nitride, an etching process utilizing hot phosphoric acid can be used. Following the removal of the anchoring structure 18P, each hard mask cap 12P may be removed utilizing any well known material removal process including, for example, a planarization process such as chemical mechanical polishing. In some embodiments, the anchoring structure 18P and each hard mask cap 12P can be removed simultaneously utilizing a same material removal process. For example, a planarization process such as, for example, chemical mechanical polishing and/or grinding, can be used to simultaneously remove the anchoring structure 18P and each hard mask cap 12P from the exemplary semiconductor structure. Each dielectric spacer 14 is thereafter removed utilizing any well know removal process that is selective in removing the dielectric material that provides the dielectric spacer 14.

Figure 10:
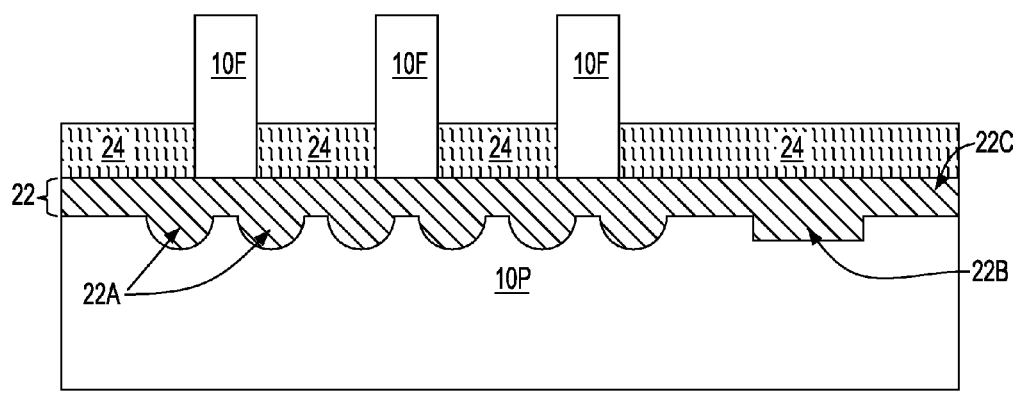
FIG. 10 is a cross sectional view of the exemplary semiconductor structure of FIG. 9 after forming a local isolation structure between each semiconductor fin.

Referring now to FIG. 10, there is illustrated the exemplary semiconductor structure of FIG. 9 after forming a local isolation structure 24 between each semiconductor fin 10F. In some embodiments of the present application, this step of forming the location isolation structure 24 can be omitted. When formed, each local isolation structure 24 can be formed by deposition of a trench dielectric material such as, a trench dielectric oxide, and thereafter planarization and/or a recess etch may be used to provide the local isolation structure 24. In some embodiments, the trench dielectric material only partially fills the gaps between each semiconductor fin 10F and as, such, planarization is not needed. In such an embodiment, a recess etch may, or may not, be needed to provide the local isolation structure 24.

As is shown, the height of each local isolation structure 24 is less than the height of each semiconductor fin 10F such that upper sidewall surfaces and a topmost surface of each semiconductor fin 10F are exposed; if a hard mask cap is present the topmost surface of each semiconductor fin 10F may remain unexposed. The height of the local isolation structure 24 may vary so long as the height is sufficient enough to cover a least a lower portion of each semiconductor fin 10F and the topmost surface of the oxide layer 22.

Figure 11:
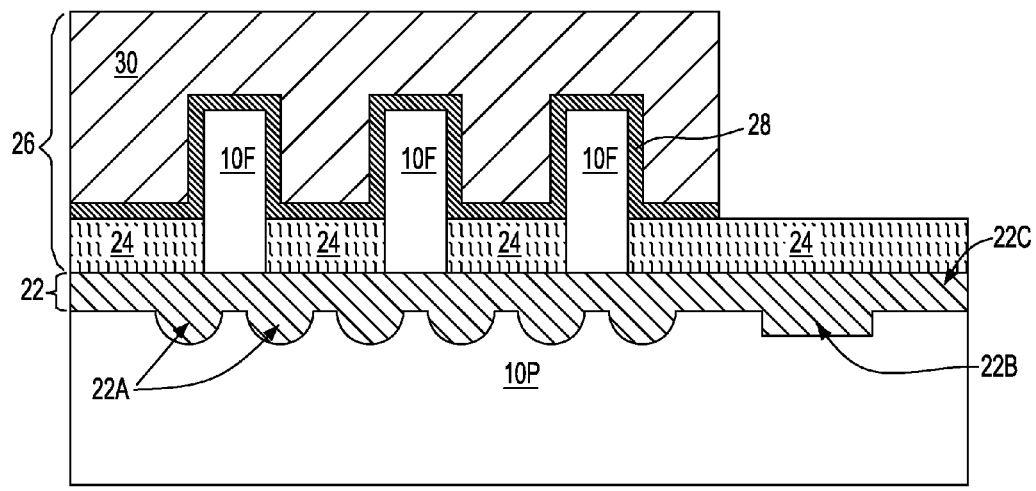
FIG. 11 is a cross sectional view of the exemplary semiconductor structure of FIG. 10 after forming a functional gate structure straddling each semiconductor fin.

Referring now to FIG. 11, there is illustrated the exemplary semiconductor structure of FIG. 10 after forming a functional gate structure 26 straddling each semiconductor fin 10F. By "functional gate structure" it is meant a permanent gate structure used to control output current (i.e., flow of carriers in the channel) of a semiconducting device through electrical or magnetic fields. The functional gate structure 26 that is formed includes a gate material stack of, from bottom to top, a gate dielectric portion 28 and a gate conductor portion 30. In some embodiments, a gate cap portion (not shown) can be present atop the gate conductor portion 30. Although a single functional gate structure is described and illustrated, a plurality of functional gate structures straddling over different portions of each semiconductor fin 10F may be formed.

The gate dielectric portion 28 comprises a gate dielectric material. The gate dielectric material that provides the gate dielectric portion 28 can be an oxide, nitride, and/or oxynitride. In one example, the gate dielectric material that provides the gate dielectric portion 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 28. In some embodiments, and when multiple functional gate structures are formed, a first set of functional gate structures may have a different gate dielectric material than a second set of functional gate structures. In other embodiments, and when multiple functional gate structures are formed, each functional gate structure comprises a same gate dielectric material.

The gate dielectric material used in providing the gate dielectric portion 28 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of the different functional gate structures, block mask technology can be used. In one embodiment of the present application, the gate dielectric material used in providing the gate dielectric portion 28 can have a thickness in a range from 1 nm to 10 nm. Other thicknesses that are lesser than, or greater than, the aforementioned thickness range can also be employed for the gate dielectric material.

The gate conductor portion 30 comprises a gate conductor material. The gate conductor material used in providing the gate conductor portion 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, and when multiple functional gate structures are formed, a first set of functional gate structures may have a different gate conductor material than a second set of functional gate structures. For example, one set of functional gate structures may comprise an nFET gate metal, while another set of functional gate structures may comprise a pFET gate metal. In other embodiments, and when multiple functional gate structures are formed, each functional gate structure comprises a same gate conductor material.

The gate conductor material used in providing the gate conductor portion 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions of multiple functional gate structures, block mask technology can be used. In one embodiment, the gate conductor material used in providing the gate conductor portion 30 has a thickness from 1 nm to 100 nm. Other thicknesses that are lesser than, or greater than, the aforementioned thickness range can also be employed for the gate conductor material used in providing the gate conductor portion 30.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

The functional gate structure 26 can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, at least one sacrificial gate structure is first provided instead of a functional gate structure. By "sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap materials mentioned above for gate cap portions. The sacrificial gate structures can be formed by deposition of the various material layers and then patterning the resultant sacrificial dielectric material sack by utilizing, for example, lithography and etching.

After forming the gate structure (functional and/or sacrificial gate structure) source/drain regions (not shown) can be formed utilizing an epitaxial growth process from exposed portions of each of the semiconductor fins 10F that are not protected by the gate structure; the source/drain regions would by located within a plane that runs into and out of the drawing illustrated in FIG. 11. The source/drain regions may comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   forming a plurality of semiconductor fins extending upwards from a remaining portion of a bulk semiconductor substrate, wherein a hard mask cap is present on each semiconductor fin of said plurality of semiconductor fins;
   forming a sacrificial dielectric material portion between each semiconductor fin of said plurality of semiconductor fins, wherein each sacrificial dielectric material portion has a topmost surface that is vertically offset and located below a topmost surface of each hard mask cap;
   forming an anchoring structure having an opening atop each sacrificial dielectric material portion and each hard mask cap, said opening is located in an area between said semiconductor fins;
   removing an entirety of each sacrificial dielectric material portion by etching through said opening in said anchoring structure;
   forming an oxide layer within an upper portion of said remaining portion of said bulk semiconductor substrate, wherein a portion of said oxide layer extends beneath each semiconductor fin; and
   removing said anchoring structure.

2. The method of claim 1, wherein said forming said plurality of semiconductor fins comprises:
   forming a hard mask layer on a surface of said bulk semiconductor substrate; and
   patterning said hard mask layer and an upper semiconductor material portion of said bulk semiconductor substrate.

3. The method of claim 2, wherein said patterning comprises a sidewall image transfer process.

4. The method of claim 1, further comprising forming a dielectric spacer on sidewall surfaces of each semiconductor fin prior to said forming said sacrificial dielectric material portion, and wherein each dielectric spacer is removed after said removing said anchoring structure.

5. The method of claim 1, further comprising removing each hard mask cap from atop each semiconductor fin, wherein said removing each hard mask cap is performed simultaneously with, or after, said removing of said anchoring structure.

6. The method of claim 1, wherein said forming said sacrificial dielectric material portion comprises:
   forming a sacrificial dielectric material between each semiconductor fin; and recessing an upper portion of said sacrificial dielectric material.

7. The method of claim 1, wherein said forming said anchoring structure having said opening comprises:
depositing an anchoring element; and
patterning said anchoring element by lithography and etching.

8. The method of claim 1, wherein said etching used to remove said entirety of each sacrificial dielectric material portion comprises utilizing hydrofluoric acid or a buffered oxide etchant.

9. The method of claim 1, wherein said forming said oxide layer comprises a bottom oxidation process.

10. The method of claim 9, wherein said bottom oxidation process comprises an oxidizing ambient and a thermal oxidation temperature from 400° C. to 1300° C.

11. The method of claim 10, wherein said oxidizing ambient is admixed with an inert gas, wherein said inert gas constitutes from 2 volume % to 95 volume % of said oxidizing ambient.

12. The method of claim 1, wherein said portion of said oxide layer that is beneath each semiconductor fin represents a first portion of a first thickness, said oxide layer further comprising at least one second portion of a second thickness that is located directly beneath said opening and third portions of a third thickness that constitute a remainder of said oxide layer, wherein said first thickness is greater than said second thickness, and said second thickness is greater than said third thickness.

13. The method of claim 1, further comprising forming a local isolation structure between each semiconductor fin, wherein said forming said local isolation structure is performed after removing said anchoring element.

14. The method of claim 1, further comprising forming a functional gate structure straddling over each semiconductor fin.

* * * * *